(12) United States Patent
Ewen et al.

(10) Patent No.: US 6,862,322 B1
(45) Date of Patent: Mar. 1, 2005

(54) SWITCHABLE-BANDWIDTH OPTICAL RECEIVER

(75) Inventors: John Farley Ewen, Rochester, MN (US); William K. Hogan, Rochester, MN (US); Kenneth Paul Jackson, Rochester, MN (US); Michael William Marlowe, Rochester, MN (US); Clint Lee Schow, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/574,239

(22) Filed: May 19, 2000

(51) Int. Cl.⁷ ............................................... H03K 9/00
(52) U.S. Cl. ...................... 375/316; 375/377; 370/468; 340/855.7; 455/266; 398/202
(58) Field of Search .................. 370/468; 455/266; 340/855.7; 375/240, 316, 377; 359/325, 333, 885, 891; 398/202, 208, 210, 203, 204

(56) References Cited

U.S. PATENT DOCUMENTS

| | | | | |
|---|---|---|---|---|
| 4,317,236 A | | 2/1982 | Bosch et al. ................ 455/608 |
| 4,574,249 A | * | 3/1986 | Williams ...................... 330/59 |
| 4,792,993 A | * | 12/1988 | Ma ............................. 455/266 |
| 4,835,778 A | | 5/1989 | Kafka et al. .................... 372/6 |
| 5,055,759 A | * | 10/1991 | Miyahara .................... 318/651 |
| 5,157,684 A | | 10/1992 | Benda et al. ................. 372/95 |
| 5,257,285 A | * | 10/1993 | Thorp ......................... 375/229 |
| 5,432,474 A | * | 7/1995 | Lauffenburger et al. .... 330/252 |
| 2003/0026290 A1 | * | 2/2003 | Umayabashi ............... 370/468 |

FOREIGN PATENT DOCUMENTS

| | | | | |
|---|---|---|---|---|
| EP | 314373 A2 | * | 5/1989 | ............ H04B/9/00 |
| JP | 03270504 A | * | 12/1991 | ............ H03F/1/42 |
| WO | WO 9100655 A | * | 1/1991 | ............ H03B/1/10 |

* cited by examiner

Primary Examiner—Tesfaldet Bocure
Assistant Examiner—Pankaj Kumar
(74) Attorney, Agent, or Firm—Christopher H. Lynt; Matthew J. Bussan

(57) ABSTRACT

A switchable bandwidth optical receiver is implemented in a front-end of the receiver in at least one of three ways. A switchable impedance may be provided at the input to a preamplifier of the front end, the preamplifier of the front-end may have a switchable impedance therein, and/or a switchable filter may be provided at an output of the preamplifier.

16 Claims, 11 Drawing Sheets

SWITCHABLE-BANDWIDTH OPTICAL RECEIVER

BACKGROUND OF THE INVENTION

1. Field of the Invention

The invention relates to the field of optical receivers and transceivers capable of operating at multiple data rates, and preferably having autonegotiation capabilities.

2. Background Information

Currently, standards are being developed for relatively high-speed multi-Giga-bit-per second (Gb/s) optical links. However, optical transceiver users may require future transceivers to inter-operate with lower-speed 'legacy' transceivers. Therefore, future optical transceivers should be capable of operating at different speeds. Ideally, an optical transceiver should either be capable of internally detecting the operating bit-rate (also referred to as operating speed or signaling rate herein) of the signal that is presented to it, or have an external input that provides information on the link operating speed. Further, based upon the determined operating bit-rate, the transceiver should be able to dynamically change the characteristics of either its transmitter or receiver, or both, in order to produce a functional, standard-compliant link at the proper signaling rate.

The ability to dynamically detect the operating bit-rate and adjust the transmission and reception of a transceiver to match the detected rate is sometimes referred to as "auto-negotiation."

In addition, it is desirable that the functionality of the optical transceiver be independent of the physical form-factor of the transceiver and, therefore, the transceiver should be able to be implemented in any physical package, i.e., GBIC (GigaBit Interface Converter), Small-Form-Factor, 1×9, etc., in addition to be available in fixed or hot-pluggable variants.

If the optical transceivers currently under development were able to inter-operate with other transceivers already in use that have been designed for different signaling rates, then this would allow users to continue to operate the large base of installed optical transceivers and upgrade to higher performance transceivers without making the 'legacy' devices obsolete. An optical transceiver that is capable of operation with such functionality could be inserted into an optical link operating at any speed and be able to adapt its performance to match the requirements of the link.

However, the ability to inter-operate with legacy transceivers is a feature that has not previously been achieved in successive generations of optical transceivers. That is, the problem of producing an optical transceiver capable of standard-compliant operation at multiple bit-rates has not previously been overcome. One technical challenge is implementing a receiver front-end design (photodetector and transimpedance amplifier) that is capable of dynamic bandwidth modification. Therefore, an optical transceiver that is designed to operate at multiple data rates would require an optical receiver whose bandwidth can be dynamically modified.

For example, currently optical transceivers are being developed that will operate at the double-speed Fibre Channel (FC) bit-rate of 2.125 Gb/s. However, already installed 'legacy' transceivers operate at a bit-rate of 1.0625 Gb/s. Therefore, transceivers which are able to inter-operate with legacy full-speed FC transceivers that work at a bit-rate of 1.0625 Gb/s would be, desirable. That is, it would be desirable to produce a transceiver that is capable of operation in compliance with the double-speed Fibre Channel standard at 2.125 Gb/s and the legacy full-speed FC standard of 1.0625 Gb/s. Such a transceiver would allow users to upgrade the capacity of their optical data links without making legacy components obsolete. Transceivers with this functionality could be applicable to Gigabit Ethernet, Fibre Channel, Infiniband, ATM, and SONET networks, along with future optical networking standards that are developed.

However, a problem that arises in achieving the desired interoperability between these two generations of transceivers, for example, is that the 1.0625 Gb/s FC specification imposes a maximum receiver bandwidth limit of 1.5 GHz. The conventional rule of thumb is that for 2.125 Gb/s operation, a receiver bandwidth of 1.6 GHz is required. Therefore, compliance with the 1.0625 Gb/s standard and the ability to operate at 2.125 GB/s impose conflicting requirements on the receiver bandwidth of the optical transceivers. In order to produce a transceiver that is capable of working at both signaling rates, the bandwidth of the receiver must be switchable.

Therefore, there is a need for an optical transceiver that has the ability to adapt the receiver bandwidth to that required for the link operating speed. In particular, a receiver capable of operating at both the lower or lowest speed, and the higher or highest speed, should be able to adjust its bandwidth to comply with the maximum bandwidth allowed by the respective speed standard. It would also be desirable if the receiver had the ability to detect link operating speed dynamically thereby fully realizing autonegotiation capabilities.

Although the FC signaling rates of 2.125 Gb/s and 1.0625 Gb/s were used as an example above, the general methodology needed for controlling receiver bandwidth is equally applicable to different operating bit-rates and other optical networking standards. Further, it should be apparent that the need is not necessarily limited to a receiver capable of operating at just two different bit-rates, but is applicable to a receiver capable of operating at two or more different selectable bit-rates.

IBM Technical Disclosure Bulletin (TDB) Vol. 37, No. 10 (October 1994) at page 69 describes a "Filter Method to use Self-Pulsating Lasers at Gigabit Data Rates." IBM TDB Vol. 37, No. 12 (Dec. 1994) at page 301 describes an "Adjustable Bandwidth Hybrid Receiver."

Therefore, it is apparent that a switchable-bandwidth receiver capable of operating at multiple bit rates and making it possible to implement the functionality of link-speed autonegotiation in future optical data links is needed. In addition, methodologies for dynamically controlling the optical receiver's bandwidth should be independent of the physical form-factor of the transceiver. The methodologies should also be applicable to both single-ended and differential optical receiver designs.

Therefore, a need exists for a switchable-bandwidth optical receiver.

SUMMARY OF THE INVENTION

It is, therefore, a principle object of this invention to provide a method and apparatus for implementing a switchable-bandwidth optical receiver.

It is another object of the invention to provide a method and apparatus that solves the above mentioned problems so that transceivers capable of operating at multiple standard-compliant data rates are realized, and transceivers having autonegotiation capabilities are available to optical transceiver users.

These and other objects of the present invention are accomplished by the method and: apparatus disclosed herein.

According to an aspect of the invention, the functionality of the optical transceiver is independent of the physical form-factor of the transceiver and, therefore, able to be implemented in any physical package, i.e., GBIC (GigaBit Interface Converter), Small-Form-Factor, 1×9, etc., in addition to fixed or hot-pluggable variants.

According to an aspect of the invention, the transceiver is able to inter-operate with other transceivers that may have been designed for different signaling rates, allowing users to continue to operate the large base of installed optical transceivers and upgrade to higher performance transceivers without making the legacy devices obsolete.

According to an aspect of the invention, the optical transceiver is insertable into an optical link operating at any speed and able to adapt its performance to match the requirements of the link.

According to another aspect of the invention, the transceiver has the ability to inter-operate with legacy transceivers, having the ability to adjust bandwidth based on a detection of link operating speed. The transceiver allows users to upgrade the capacity of their optical data links without making legacy components obsolete.

According to another aspect of the invention, the transceiver is capable of dynamic bandwidth modification. That is, the bandwidth of the transceiver is switchable based on detection of an input signal bandwidth requirement.

According to another aspect of the invention, the transceiver is capable of operation in compliance with the double-speed Fibre Channel standard at 2.125 Gb/s and the legacy full-speed FC standard of 1.0625 Gb/s. Such a transceiver would also be applicable to Gigabit Ethernet, Fibre Channel, Infiniband, ATM, and SONET networks, along with future optical networking standards that are developed.

According to another aspect of the invention, a switchable-bandwidth receiver, capable of operating at multiple bit rates, and making it possible to implement the functionality of link-speed autonegotiation in future optical data links, is provided.

According to another aspect of the invention, methodologies for controlling the optical receiver's bandwidth are independent of the physical form-factor of the transceiver, and are applicable to both single-ended and differential optical receiver designs.

According to another aspect of the invention, three general ways in which the bandwidth of an optical receiver can be controlled may be implemented. These include modifying the impedance or frequency-response characteristics of the receiver at the input to the preamplifier (e.g., a transimpedance amplifier TIA); modifying the frequency response characteristics of the TIA itself; and modifying the frequency response characteristics of the receiver at the output of the TIA.

According to an aspect of the invention, a transceiver and, in particular, a receiver design, that allows the receiver bandwidth to be adjusted can be used in a transceiver having autonegotiation capabilities, i.e., where the speed is dynamically detected and adjusted according to the input signal. Such a transceiver may include clock recovery within the design, for example.

These and other aspects of the invention will become apparent from the detailed description set forth below.

DETAILED DESCRIPTION OF THE PREFERRED EMBODIMENT(S)

The invention will now be described in more detail by way of example with reference to the embodiment(s) shown in the accompanying figures. It should be kept in mind that the following described embodiment(s) is/are only presented by way of example and should not be construed as limiting the inventive concept to any particular physical configuration.

Figure 1:
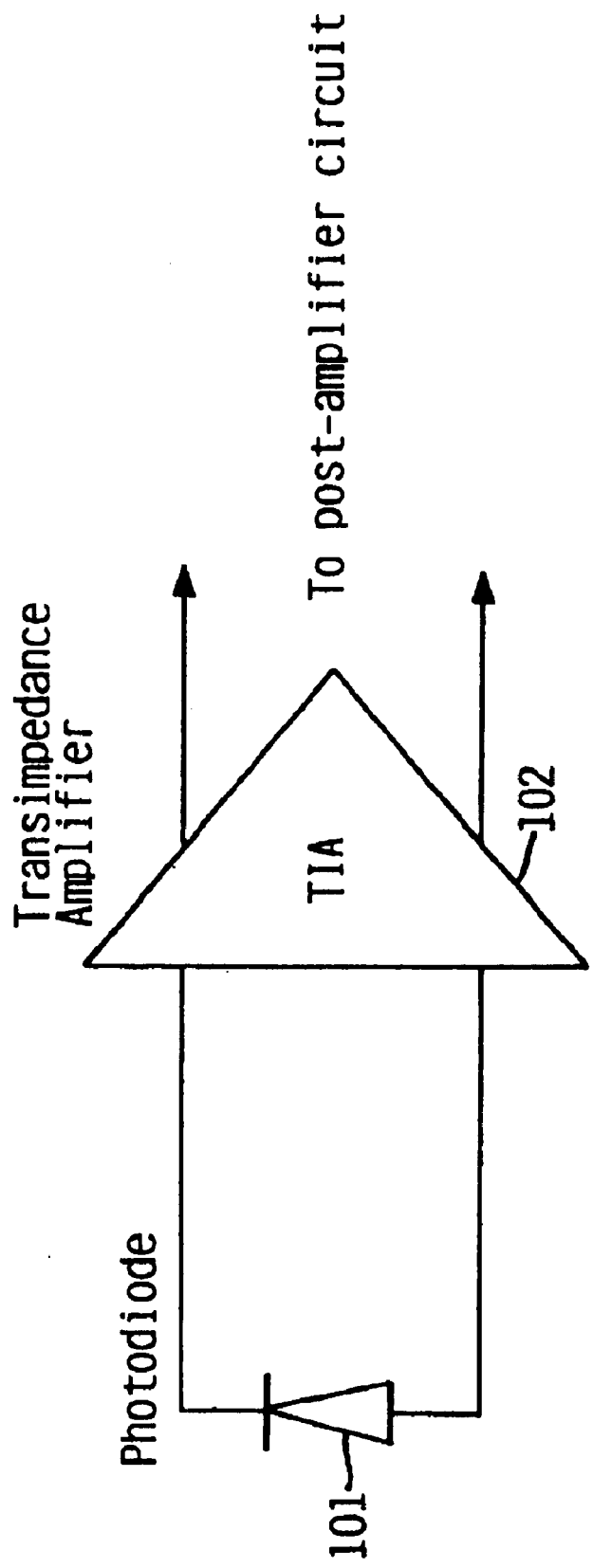
FIG. 1 illustrates a typical optical receiver front-end.

FIG. 1 illustrates a typical optical receiver front-end. An optical receiver "front-end"" consists of a photodetector 101 (e.g., p-i-n, MSM, APD, etc.) coupled with a preamplifier circuit 102, typically implemented in a transimpedance amplifier (TIA) configuration. The photodetector 101 converts incident light into an electrical current that the preamplifier circuit 102 transforms into a voltage signal output with a peak-to-peak amplitude in the mV range. This general optical receiver front-end topology is depicted in FIG. 1.

Figure 2A:
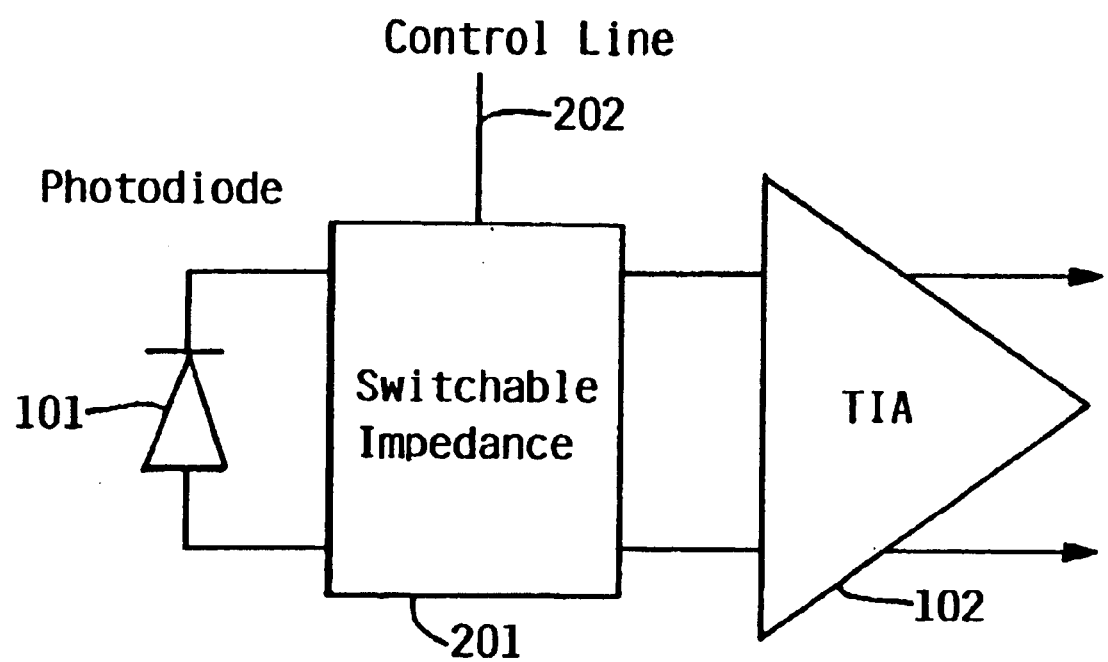
FIG. 2a illustrates an optical receiver front-end having a switchable impedance according to an exemplary embodiment of the invention.
Figure 2B:
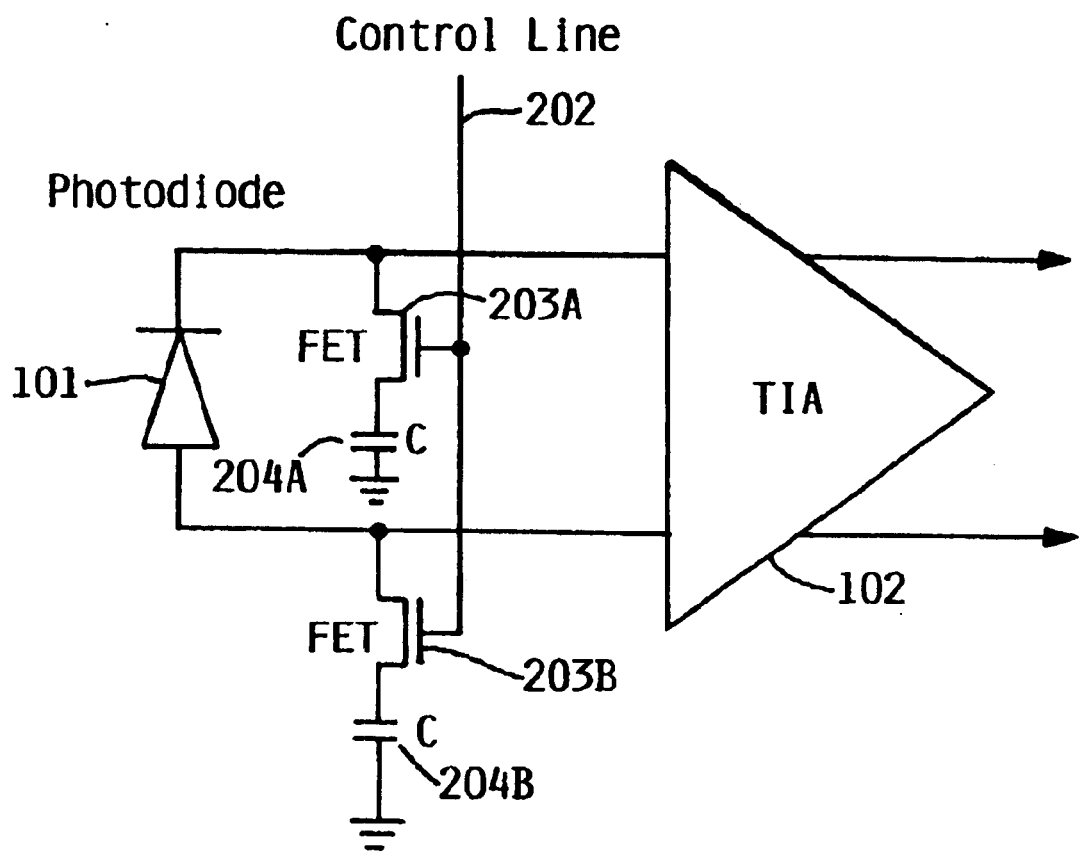
FIG. 2b illustrates an exemplary implementation of an optical receiver front-end having a switchable impedance of FIG. 2a, according to an exemplary embodiment of the invention.

Three general methods by which the bandwidth of an optical receiver can be controlled will be described according to the invention. The first way to control the bandwidth is by modifying the impedance or frequency-response characteristics of the receiver at the input to the TIA. This is illustrated in FIGS. 2a and 2b.

The second way to control the bandwidth is by modifying the frequency response characteristics of the TIA itself. This is illustrated in FIG. 3

The third way to control the bandwidth is by modifying the frequency response characteristics of the receiver at the output of the TIA.

Figure 4A:
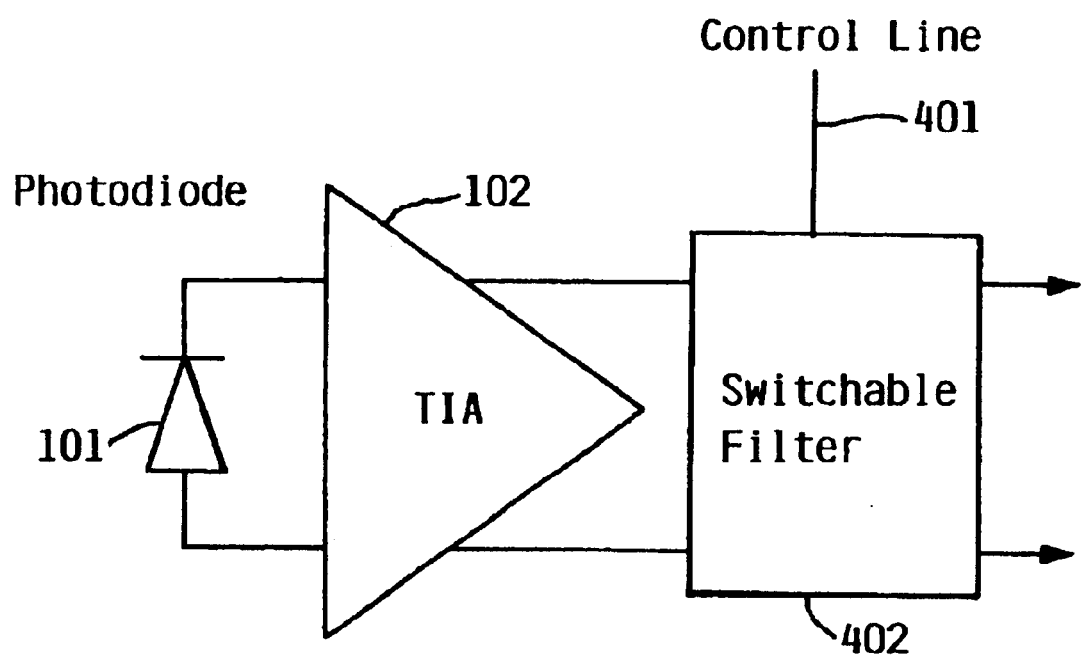
FIG. 4a illustrates an optical receiver front-end having a switchable-bandwidth implemented by providing a switchable filter at the output of the transimpedance amplifier according to an exemplary embodiment of the invention.
Figure 4B:
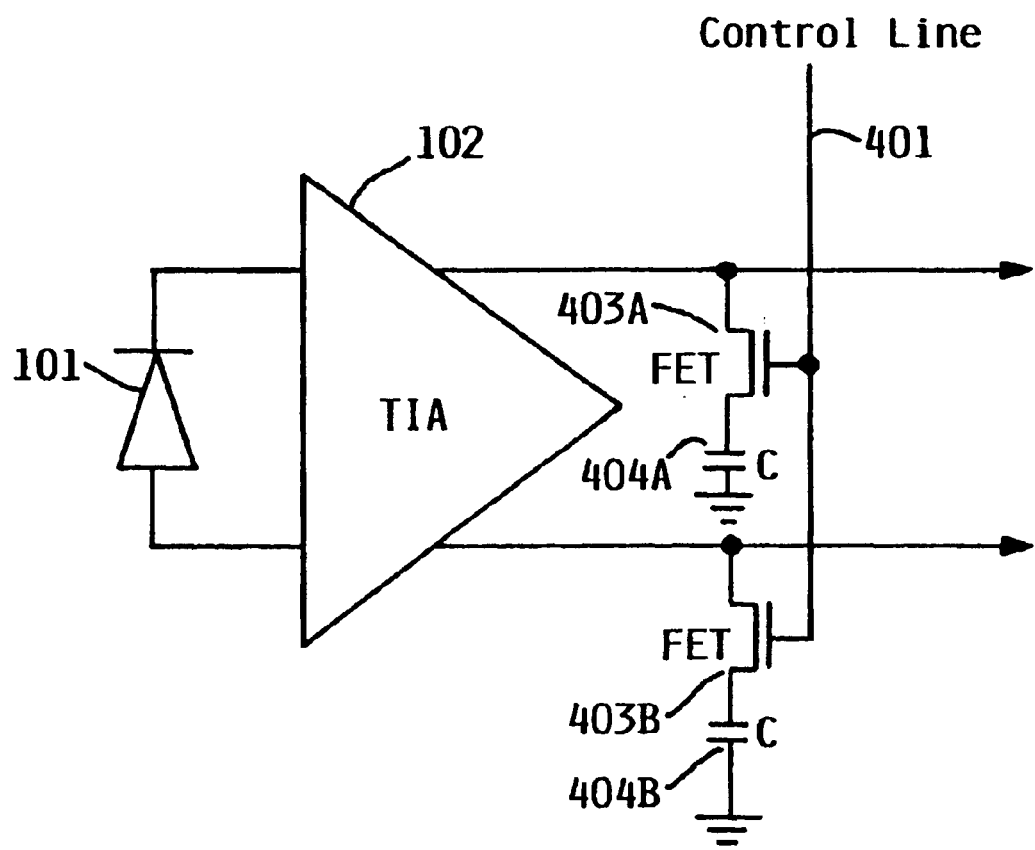
FIG. 4b illustrates an exemplary implementation of the switchable filter at the output of the transimpedance amplifier of FIG. 4a, according to an exemplary embodiment of the invention.

This is illustrated in FIGS. 4a and 4b.

In more detail, FIG. 2a illustrates an optical receiver front-end having a switchable impedance according to an exemplary embodiment of the invention and FIG. 2b illustrates an exemplary implementation of an optical receiver front-end having a switchable impedance of FIG. 2a. FIG. 2a illustrates a modification to the traditional optical receiver topology that can be used to control the bandwidth of an optical receiver by changing the impedance or frequency-response characteristics at the input of the TIA.

In FIG. 2a, a switchable impedance element 201 is coupled with the photodiode 101 and the input of the transimpedance amplifier 102 has been added to the basic receiver topology of FIG. 1. A control line 202 is used to switch the impedance of block 201 according to the bandwidth requirements of an input. These bandwidth requirements could be detected dynamically or be fixed. That is, the control signal could be dynamically derived from an input signal, or be fixed according to an installation specification.

One specific implementation of the topology shown in FIG. 2a is illustrated in FIG. 2b. In particular, as illustrated in FIG. 2b, a respective field effect transistor (FET) 203A, 203B switch and a capacitor 204A, 204B are disposed across each input of the TIA 102. The gates of both FET's 203A, 203B are connected to a control line 202. The FET's 203A, 203B are used as switches to switch the capacitors 204A, 204B to form a parallel circuit (the capacitors 204A and 204B are connected together at a common ground) with the photodiode 101 across the inputs to the TIA 102. The bandwidth of the receiver is typically dominated by the combination of the input impedance of the TIA 102 and the impedance of the photodiode 101. However, when the FET's 203A, 203B are turned on, the impedance of the capacitors 204A, 204B (with the FET's 203A, 203B) appears in parallel with the photodiode 101. In this state, the bandwidth of the receiver is reduced in a controlled manner from its value when the FET's 203A, 203B are turned off. When an FET is OFF, it is essentially an open circuit, and when ON, an FET is essentially a short circuit. The ON impedance of each of the FET's 203A, 203B, which is in series with the capacitors 204A, 204B, contributes to the bandwidth reduction. The circuit is drawn with N-type FET's, however the invention is not limited to this particular implementation, and the use of other devices is possible within the spirit and scope of the invention.

Figure 2C:
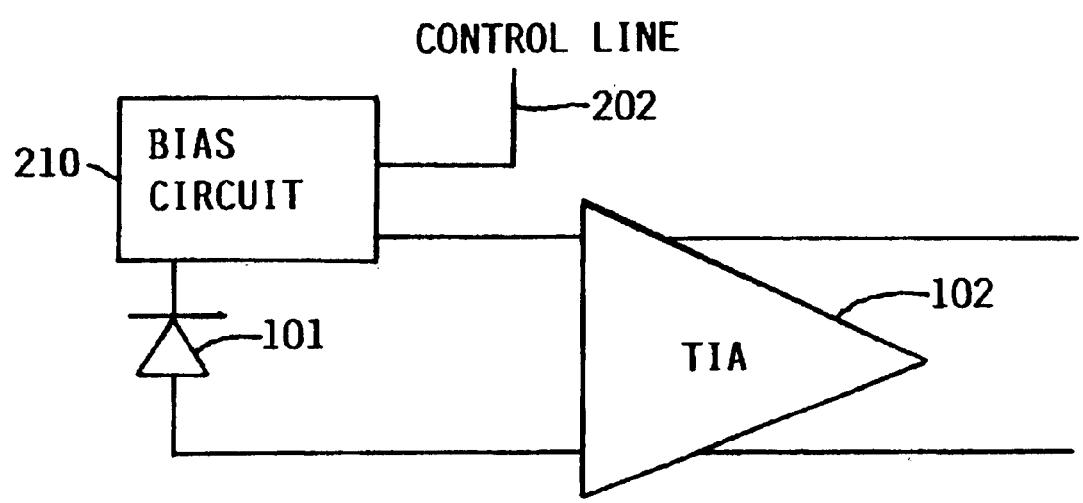
FIG. 2c illustrates another exemplary implementation of an optical receiver front-end operative to change the impedance at the input in a controlled way, according to an exemplary embodiment of the invention.

In another implementation of the invention, shown in FIG. 2c, which is operative to change the impedance at the input to the TIA 102 in a controlled way, the bias voltage of the photodiode 101 is changed with a controllable bias circuit 210 using control line 202. Since the capacitance of a p-i-n photodiode at relatively low bias voltages is inversely proportional to the voltage applied to the photodiode, this property of the photodiode 101 can be exploited to control the impedance presented to the input of the TIA 102. In this way, the bandwidth of the optical receiver can be controlled. The bias voltage of the photodiode 101 can also be used to control the transit-time of optically-generated carriers, which under low bias voltages is directly proportional to the applied bias, in order to modify the frequency response of the photodiode, and therefore the bandwidth of the optical receiver.

Figure 3A:
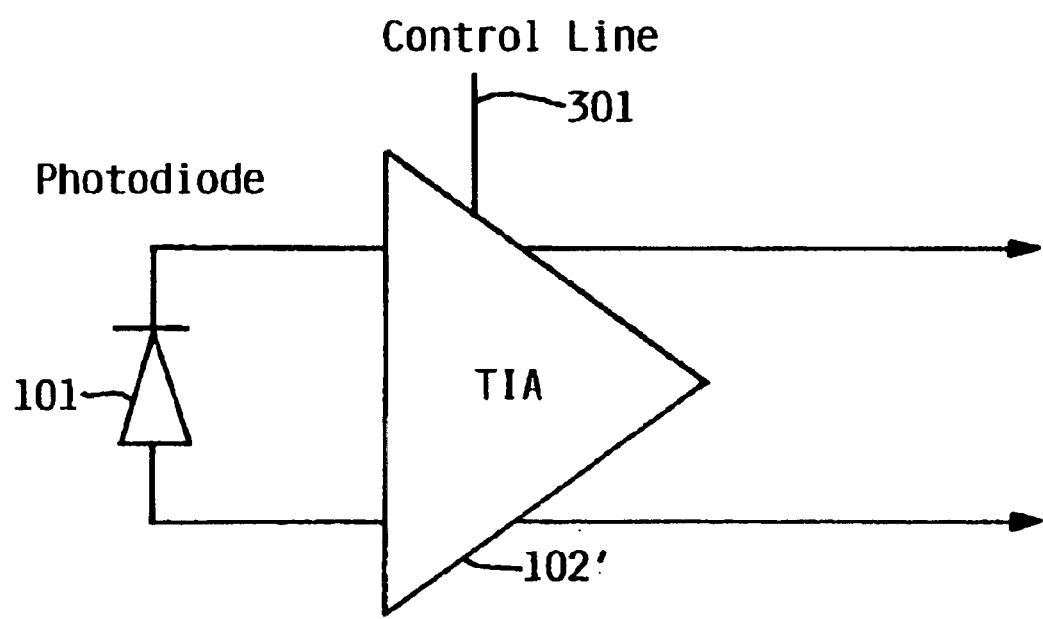
FIG. 3a illustrates an optical receiver front-end having a control line for directly controlling the bandwidth of the transimpedance amplifier itself according to/an exemplary embodiment of the invention.

FIG. 3a illustrates an optical receiver front-end having a control line 301 for directly controlling the bandwidth of the transimpedance amplifier 102' itself according to an exemplary embodiment of the invention. In this figure, a control line 301 is presented to a TIA 102' that has the capability of dynamically adjusting it's bandwidth based upon the signal applied to the control line 301.

There are many ways that the bandwidth of the TIA 102' could be controlled; and one straight-forward method would be to use the control line 301 to switch-in additional impedance at a high-impedance node of the TIA 102', forcing the pole at the node to occur at a lower frequency.

Figure 3B:
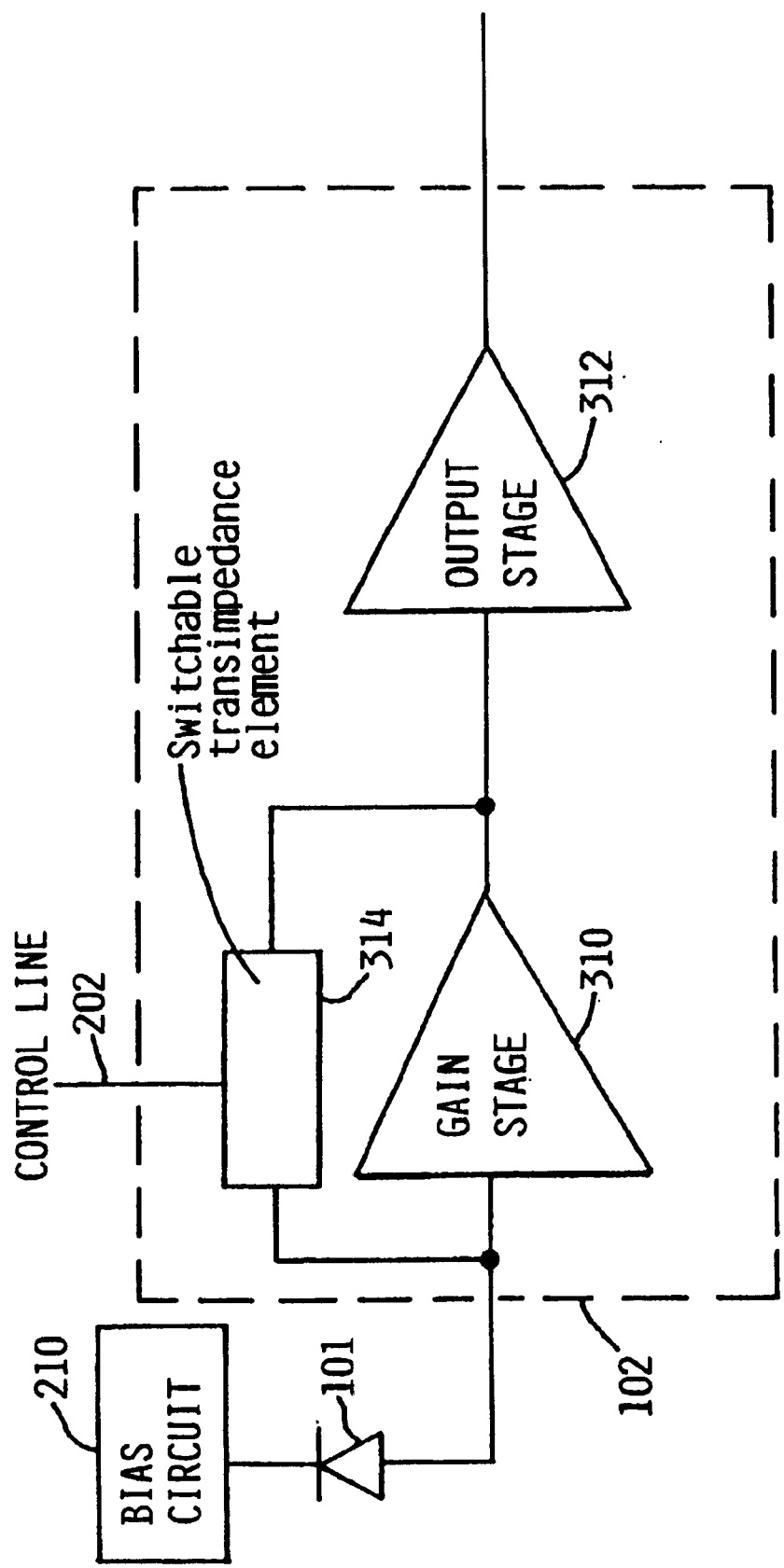
FIG. 3b illustrates an exemplary implementation of the optical receiver front-end of to FIG. 3a, according to an exemplary embodiment of the invention.

FIG. 3b illustrates one exemplary implementation of the optical receiver front-end of to FIG. 3a. In FIG. 3b, the TIA 102 is shown in dashed lines, and having therein a gain stage 310 and an output stage 312. Connected to the input and the output of the gain stage 310 in the manner of a feedback circuit, is a switchable transimpedance element 314, coupled to be controlled by control line 202. With the feedback element 314, the transimpedance of gain stage 310 can be changed. Because the gain and the bandwidth of the stage 310 are determined by the transimpedance feedback element 314, changing its impedance can be used to provide the bandwidth-switching function. FIG. 3b shows a single-ended configuration, however, the idea is equally applicable to a differential implementation, as would be readily apparent to one skilled in the art.

FIG. 4a illustrates an optical receiver front-end having a switchable-bandwidth implemented by providing a switchable filter 402 and control line 401 at the output of the transimpedance amplifier 102 according to an exemplary embodiment of the invention. This scheme employs a switchable filter 402 at the output of the TIA 102. When the filter 402 is switched into the path of the TIA's output signal by a control signal on control line 401, the bandwidth of the receiver path is limited by the filter's frequency response. Otherwise, when the filter 402 is switched out of the signal path, the bandwidth of the receiver-path is the full bandwidth of the TIA 102, which is designed to be sufficient for operation at the highest specified transceiver operating speed.

FIG. 4b illustrates an exemplary implementation of the switchable filter 402 and control line 401 at the output of the transimpedance amplifier 102 of FIG. 4a. Here the switchable filtering function is performed using a pair of FET's 403A and 403B, and capacitors 404A and 404B, in a similar manner to that of FIG. 2b, except that the circuitry is at the output of the TIA 102. When the FET's 403A, 403B are turned ON, the capacitors 404A and 404B (with FET's 403A, 403B) are connected across the output of the TIA 102. Coupled with the output impedance of the TIA 102, this forms a low-pass filter.

In summary, the above describes embodiments of a switchable-bandwidth optical receiver. Three general topologies that could be used to produce a switchable-bandwidth optical receiver have been described, along with specific implementation examples in each topology. An optical receiver with a dynamically controllable bandwidth will allow transceivers that are functionally capable of being included in optical links with autonegotiated transmission rates. The ability to detect the operating bit-rate and adjust the transmission and/or reception of a transceiver to match the detected rate is often referred to as "autonegotiation." This will allow operation of a large base of installed optical transceivers and the incremental upgrade to higher performance transceivers without making the legacy devices obsolete. An optical transceiver that contains a receiver with the functionality described in this disclosure will offer an enormous advantage in the marketplace because the transceiver can be inserted into an optical link operating at any speed and adapt its characteristics to match the requirements of the link.

The ability for future optical transceivers to operate with legacy transceivers is a feature that is currently very desirable. No viable solution to the problem of producing an optical transceiver that is capable of standard-compliant operation at multiple bit-rates has existed until now because of the conflicting requirements imposed on the receiver's bandwidth by multiple bit-rate operation.

Each of the three exemplary embodiments described offer different advantages, and selection of a switchable bandwidth receiver design for a particular situation would be based both upon its performance when incorporated into a complete transceiver module and its cost of implementation.

A switchable-bandwidth optical receiver will be a key component in any future optical transceivers that are capable of operation at multiple bit-rates. Some exemplary switchable-bandwidth optical receivers for incorporation into transceivers that may also be capable of bit-rate autonegotiation, have been described above. As mentioned before, bit-rate autonegotiation refers to the ability to detect the operating speed of an input signal and to adjust the reception and transmission rate in a transceiver to match the detected speed.

Ideally, an optical transceiver with switchable bandwidth according to the invention would also have dynamic speed detection capabilities, that is, either be capable of internally detecting the operating speed of the signal that is presented to it, or have an external input that provides information on the current link operating speed. In the respective illustration of the above described embodiments, a control line has been provided to provide a control signal to cause a bandwidth adjustment in the receiver front end to match the bandwidth requirements of the input signal, and this control signal would preferably be derived in one of the two ways mentioned above.

However, the switchable bandwidth receiver according to the invention need not have these dynamic speed detection capabilities, and could be used in installations where the bandwidth and speed are fixed. The bandwidth switchability advantageously allows a high-speed transceiver to be used in either a high-speed or a low-speed legacy link installation. In the low-speed link installation, the appropriate bandwidth would be selected and fixed by providing a requisite control signal that does not change.

However, in what ever way the operating bit-rate is determined, based upon the determined operating bit-rate, the transceiver will dynamically change the characteristics of either its transmitter or receiver, or both, in order to produce a functional, standard-compliant link at the proper signaling rate. Three exemplary ways of changing receiver bandwidth have already been described above. Of course, besides having the ability to adjust the bandwidth, necessarily the transceiver also has the ability to operate at the desired bit-rates.

Figure 6:
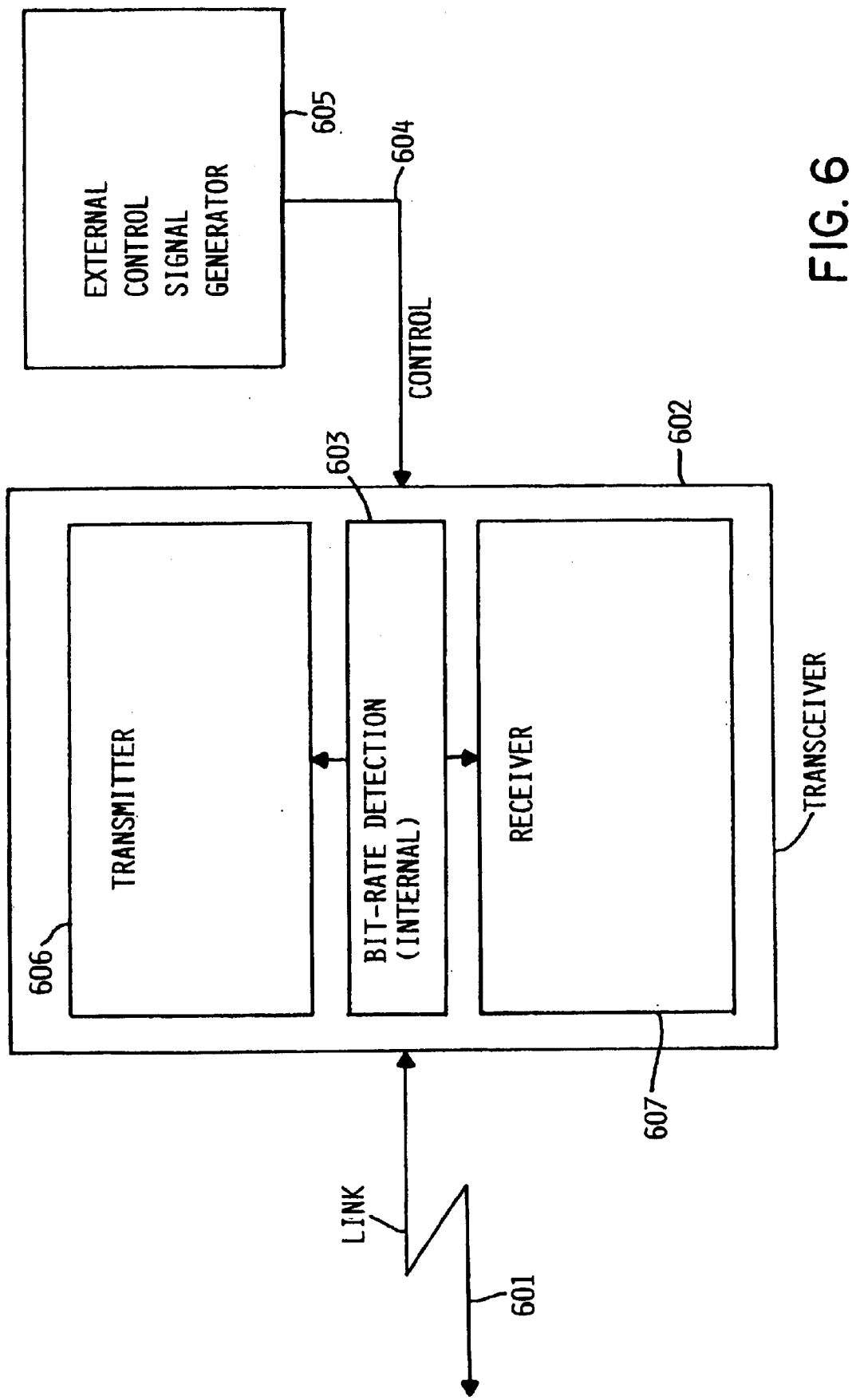
FIG. 6 illustrates a block diagram of a transceiver system having a receiver according to an exemplary embodiment of the invention.

FIG. 6 illustrates a block diagram of a transceiver system having a receiver according to an exemplary embodiment of the invention. A link 601 includes a communications medium which carries a signal, e.g., an optical signal, to and from the transceiver 602. The transceiver 602 may have an internal bit-rate detection means 603 for controlling the bandwidth/bit-rate, or a control signal 604 from an external control signal generator 605 may be provided to the transceiver 602 to adjust the transceiver bandwidth and bit-rate, as already described. The transceiver of course includes a transmitter 606, and a receiver 607 which can operate at two or more bit-rates and bandwidths.

As mentioned above, the control signal for the receiver could be based on a detection of the bit-rate of an input signal This could be done in any number of known ways, e.g., by detecting a clock signal on the input line which would be different for different bit-rates. Phase-lock-loop circuitry could be implemented in the transceiver to synchronize the transceiver with the input signal. Functionality to implement a transceiver that is capable of bit-rate discovery may include clock recovery within the transceiver. Alternatively, the control signal for the receiver could be based on an external signal providing information on the bit-rate of the link. However, these are merely examples and it should be clear that the way in which a control signal is derived is not critical to the present invention.

It will be apparent to one skilled in the art that the manner of making and using the claimed invention has been adequately disclosed in the above-written description of the preferred embodiment(s) taken together with the drawings.

It will be understood that the above described preferred embodiment(s) of the present invention are susceptible to various modifications, changes, and adaptations, and the same are intended to be comprehended within the meaning and range of equivalents of the appended claims.

As one skilled in the art would realize, other switchable impedance and/or filter implementations using different discrete components are certainly possible for the FIGS. 2b and 4b embodiments, and such are considered to be within the spirit and scope of the invention. For example, besides the preferred 'parallel' impedance (capacitance) implementations shown, equivalent series impedance (e.g., inductance) could be used, or some combination thereof, so long as the respective input and output signals can be passed when the impedance is switched in or switched out. Although the FET's illustrated in the exemplary embodiments are preferred as the switching devices, the invention is not limited to only such switching devices and any switching device could be used within the spirit and scope of the invention.

Figure 5A:
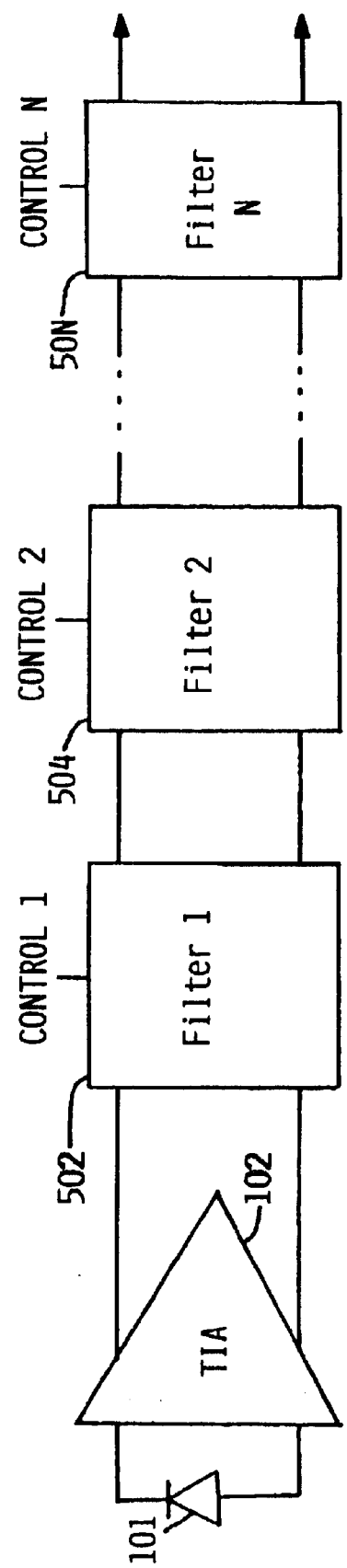
FIGS. 5a and 5b show two representative variations according to exemplary embodiments of the invention.
Figure 5B:
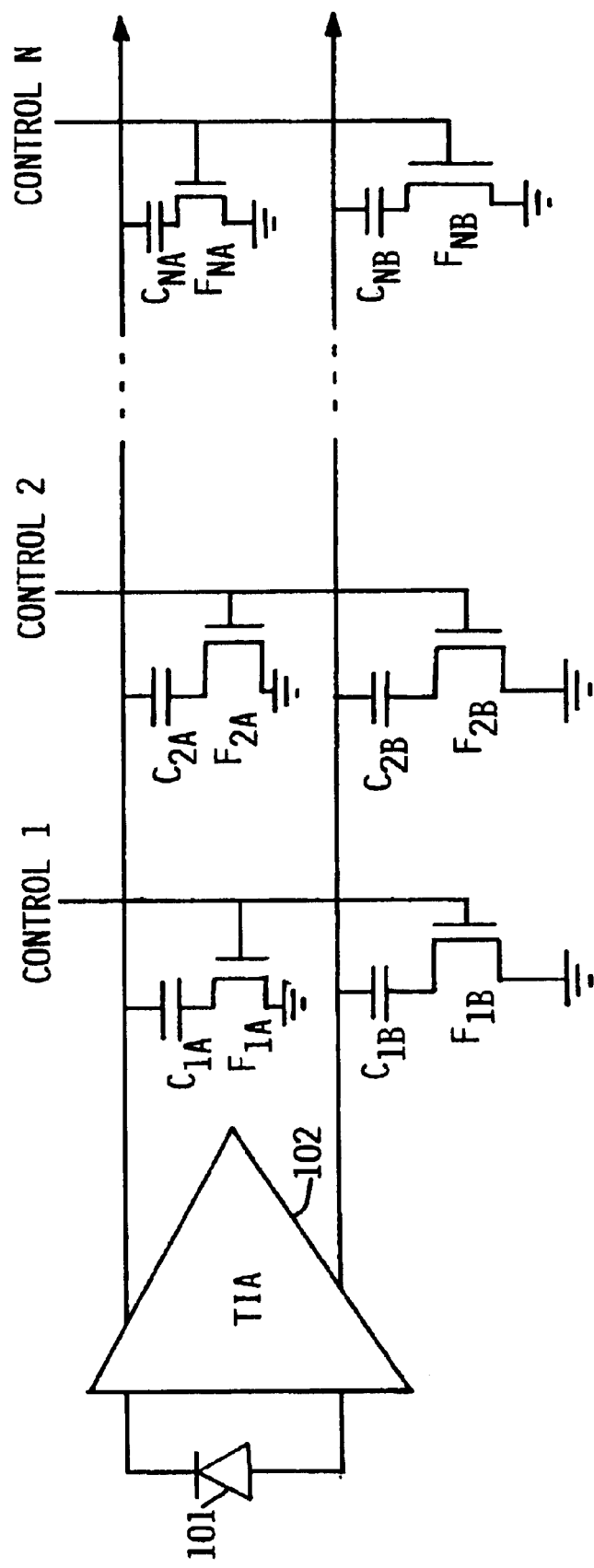

Further, the switchable impedance/filter blocks may be capable of providing two or more different bandwidth adjustments by the provision of additional components, and such is considered to be within the spirit and scope of the invention. FIGS. 5a and 5b show two representative variations in this regard. FIG. 5a shows a cascade of filter blocks 502, 504 . . . 50N, at the output of the TIA 102. FIG. 5b shows an implementation of the N filter stages of FIG. 5a using sets of capacitors and FET's, in particular, capacitors (C1A, C1B; C2A, C2B . . . CAN, CNB) and FET's (F1A, F1B; F2A, F2B . . . FNA, FNB). Each filter can be controlled independently and switched in or out of the signal path to provide the desired overall bandwidth. Although illustrated at the output of the TIA, it should be understood that a similar arrangement could alternatively be provided at the input of the TIA as well, in the spirit and scope of the invention.

Further, the respective embodiments are not mutually exclusive, that is, they could be combined in order to achieve a desired bandwidth variability for a particular application. That is, an optical front-end could have a switchable impedance at the input, such as by way of the embodiment illustrated in FIG. 2a, or by way of a controlled-bias photodiode, a preamplifier (TIA) with an internally controllable bandwidth, such as depicted in FIG. 3, and a switchable impedance at the preamplifier output, such as by way of the embodiment illustrated in FIG. 4a, or any combination thereof.

Further, although a number of equivalent components may have been mentioned herein which could be used in place of the components illustrated and described with reference to the preferred embodiment(s), this is not meant to be an exhaustive treatment of all the possible equivalents, nor to limit the invention defined by the claims to any particular equivalent or combination thereof. A person skilled in the art would realize that there may be other equivalent components presently known, or to be developed, which could be used within the spirit and scope of the invention defined by the claims.

What is claimed is:

1. An optical receiver comprising:
    an optical signal detector for detecting an optical input signal and producing an output in accordance with the optical input signal;
    a preamplifier coupled to receive the output from the optical signal detector and amplify the output signal; and
    means for changing the bandwidth of the optical receiver based on the bit-rate of the optical input signal, wherein the means for changing the bandwidth of the optical receiver comprises:
        at least one switchable impedance disposed between the optical signal detector and the preamplifier.

2. The optical receiver according to claim 1, wherein the at least one switchable impedance comprises:
    a series connection of at least one switch and at least one fixed impedance.

3. The optic receiver according to claim 2, wherein the at least one switch comprises at least one transistor.

4. The optical receiver according to claim 3, wherein the at least one transistor comprises at least one field effect transistor.

5. The optical receiver according to claim 2 wherein the at least one fixed impedance comprises a capacitance coupled in series with the at least one switch.

6. An optical receiver comprising:
    an optical signal detector for detecting an optical input signal and producing an output in accordance with the optical input signal;
    a preamplifier coupled to receive the output from the optical signal detector and amplify the output signal; and
    means for changing the bandwidth of the optical receiver based on the bit-rate of the optical input signal, wherein the means for changing the bandwidth of the optical receiver comprises at least one switchable filter disposed at an output of the preamplifier.

7. The optical receiver according to claim 6, wherein the at least one switchable filter comprises:
    a series connection of at least one switch and at least one impedance.

8. The optical receiver according to claim 4, wherein the at least one switch comprises at least one transistor.

9. The optical receiver according to claim 8, wherein the at least one transistor comprises at least one field effect transistor.

10. The optical receiver according to claim 8, wherein the at least one impedance comprises a capacitance coupled in series with the at least one switch.

11. An optical receiver comprising:
    an optical signal detector for detecting an optical input signal and producing an output in accordance with the optical input signal;
    a preamplifier coupled to receive the output from the optical signal detector and amplify the output signal; and
    means for changing the bandwidth of the optical receiver based on the bit-rate of the optical input signal, wherein the means for changing the bandwidth of the optical receiver comprises:
        means for controlling a bias of the optical signal detector.

12. An optical receiver comprising:
    an optical signal detector for detecting an optical input signal and producing an output in accordance with the optical input signal;
    a preamplifier coupled to receive the output from the optical signal detector and amplify the output signal; and
    means for changing the bandwidth of the optical receiver based on the bit-rate of the optical input signal, wherein the optical signal detector and the means for changing the bandwidth of the optical receiver comprise a controlled-bias photodetector, the impedance thereof being proportional to the bias thereon.

13. An optical receiver comprising:
    an optical signal detector for detecting an optical input signal and producing an output in accordance with the optical input signal;
    a preamplifier coupled to receive the output from the optical signal detector and amplify the output signal; and
    means for changing the bandwidth of the optical receiver based on the bit-rate of the optical input signal, wherein the means for changing the bandwidth of the optical receiver comprises a plurality of switchable filters disposed at an output of the preamplifier.

14. The optical receiver according to claim 13, wherein each of the plurality of switchable filters disposed at an output of the preamplifier are independently controllable.

15. The optical receiver according to claim 14, wherein each of the plurality of independently controllable switchable filters comprises a series connection of at least one switch and at least one impedance.

16. The optical receiver according to claim 15, wherein the at least one impedance comprises at least one capacitance coupled in series with the at least one switch, and wherein the at least one switch comprises at least one field effect transistor.

* * * * *